United States Patent [19]

Spence

[11] Patent Number: 4,763,023
[45] Date of Patent: Aug. 9, 1988

[54] CLOCKED CMOS BUS PRECHARGE CIRCUIT HAVING LEVEL SENSING

[75] Inventor: John R. Spence, Villa Park, Calif.

[73] Assignee: Rockwell International Corporation, El Segundo, Calif.

[21] Appl. No.: 15,476

[22] Filed: Feb. 17, 1987

[51] Int. Cl.[4] .................. H03K 19/003; H03K 19/096
[52] U.S. Cl. .................................... 307/480; 307/246; 307/362; 307/451; 307/481
[58] Field of Search ................ 307/443, 451, 480–481, 307/354, 362, 363, 246, 584–585, 264

[56] References Cited

U.S. PATENT DOCUMENTS

| | | | |
|---|---|---|---|
| 4,498,021 | 2/1985 | Uya | 307/443 |
| 4,598,216 | 7/1986 | Lauffer et al. | 307/481 X |
| 4,618,786 | 10/1986 | Johnson | 307/481 X |
| 4,647,797 | 3/1987 | Sanwo et al. | 307/443 |
| 4,692,639 | 9/1987 | Jordan | 307/481 X |
| 4,700,086 | 10/1987 | Ling et al. | 307/481 X |

Primary Examiner—Stanley D. Miller
Assistant Examiner—D. R. Hudspeth
Attorney, Agent, or Firm—H. Frederick Hamann; George A. Montanye; David J. Arthur

[57] ABSTRACT

A circuit for charging a capacitive load such as a data or address bus in a VLSI circuit includes a voltage source input, a PFET switch connected between the voltage source input and the capacitive load or bus, and a voltage regulator connected to the capacitive load and to the gate of the PFET switch to cause the switch to conduct during a predetermined time only if the voltage on the capacitive load is less than a predetermined voltage, and to disconnect the capacitive load from the voltage source input when the voltage on the capacitive load reaches or exceeds that predetermined voltage level. The voltage regulator may include a first inverter having its input connected to the bus and a second inverter having an input connected to the output of the first inverter and having an output connected to the control input of the switch. The first inverter is constructed to output a low level when the voltage on the first inverter input is at or above the designated predetermined voltage. The predetermined voltage level is determined by the "trigger point" of the first inverter.

17 Claims, 2 Drawing Sheets

CLOCKED CMOS BUS PRECHARGE CIRCUIT HAVING LEVEL SENSING

BACKGROUND OF THE INVENTION

VLSI devices normally include several busses for transporting data or address information from point to point in the circuit. These busses often include 16 or 32 lines, which have a rather high capacitance of 5–10 picofarads (pf). To move data from a sender circuit to a receiver circuit, the busses are first precharged by a clock to a high precharge voltage level VPC (such as 3–5 volts) during a first clock phase C1, as shown in FIG. 1. During a second clock period C2, the sender circuit is evaluated by the sending function, and each bus line is either left at the precharged voltage level (FIG. 1b) or is discharged to VSS (FIG. 1a), depending upon whether a "1" or "0" is being transmitted. During a third clock period C3, the user inputs the level on the bus line in the receiver circuit.

The precharge of the bus lines often occurs during a very short (50–100 nsec) interval, which requires large NFETs that never quite reach their final potential of three volts. If, however, PFETs are used by themselves, the PFETs precharge the bus all the way to a full five volts, which is a higher potential than the receiver circuits require, resulting in a waste of power. Such waste occurs because the precharge power is proportional to $C_{BUS}VPC^2f$, in which $C_{BUS}$ represents the capacitance of the bus line, VPC is the precharge voltage, and f represents the clock frequency. Thus, a five volt precharge dissipates $5^2/3^2 = 25/9$ as much power as a three volt precharge.

Thus, the objective of the present invention is to create a voltage-regulated P-channel circuit that precharges the bus line to a predetermined voltage level.

SUMMARY OF THE INVENTION

The present invention is a circuit for charging a capacitive load such as an integrated circuit bus line during a first time period. The circuit includes a voltage source input and a switch connected between the voltage source input and the capacitive load. A voltage regulator connected to the capacitive load and to the switch opens the switch to disconnect the capacitive load from the voltage source input when the voltage on the capacitive load reaches a predetermined voltage level. The switch may comprise a PFET having its conduction path connected between the voltage source input and the capacitive load and its gate connected to the voltage regulator.

The voltage regulator may include a first inverter having its input connected to the bus line and having an output, and constructed so that the output of the first inverter is low when the voltage on the first inverter input is at or above a predetermined voltage. The voltage regulator may also include a second inverter having an input connected to the output of the first inverter and having an output connected to the gate of the PFET forming the switch between the voltage source input and the capacitive load bus line.

DETAILED DESCRIPTION OF THE PREFERRED EMBODIMENT

Figure 1:
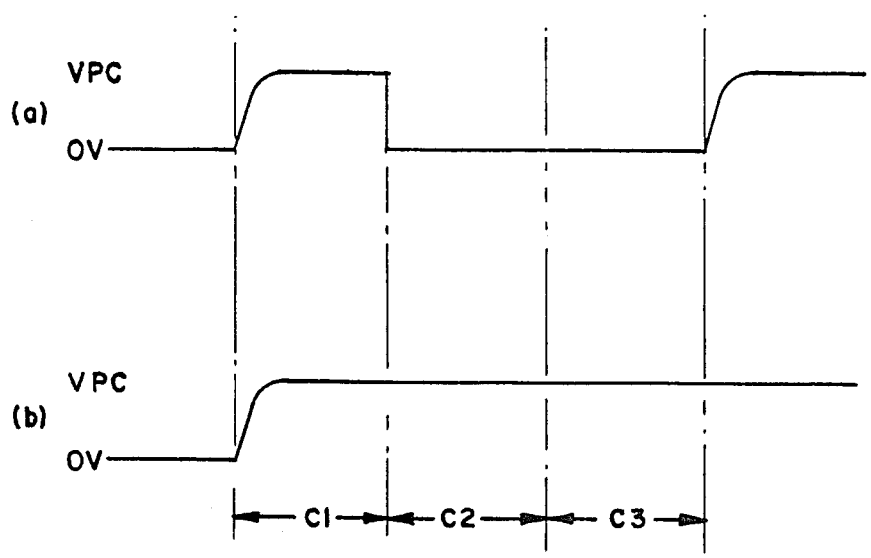
FIGS. 1(a) and 1(b) are portions of a timing diagram showing the voltage on a bus line during three clock phases of a device operation cycle.
Figure 2:
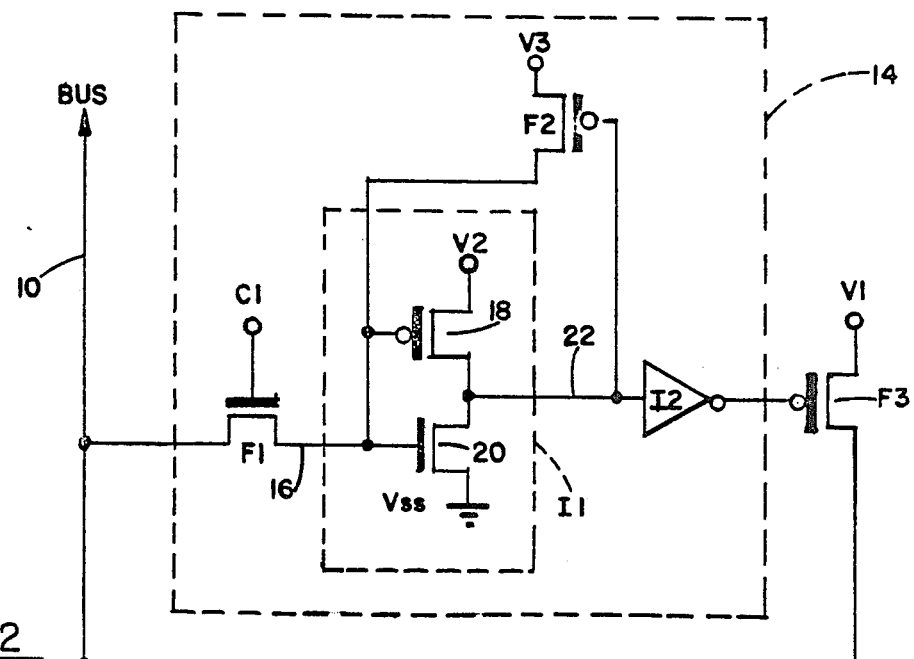
FIG. 2 shows a voltage-regulating precharge circuit constructed according to the invention, with an exemplary sender circuit and a receiver latch.
Figure 3:
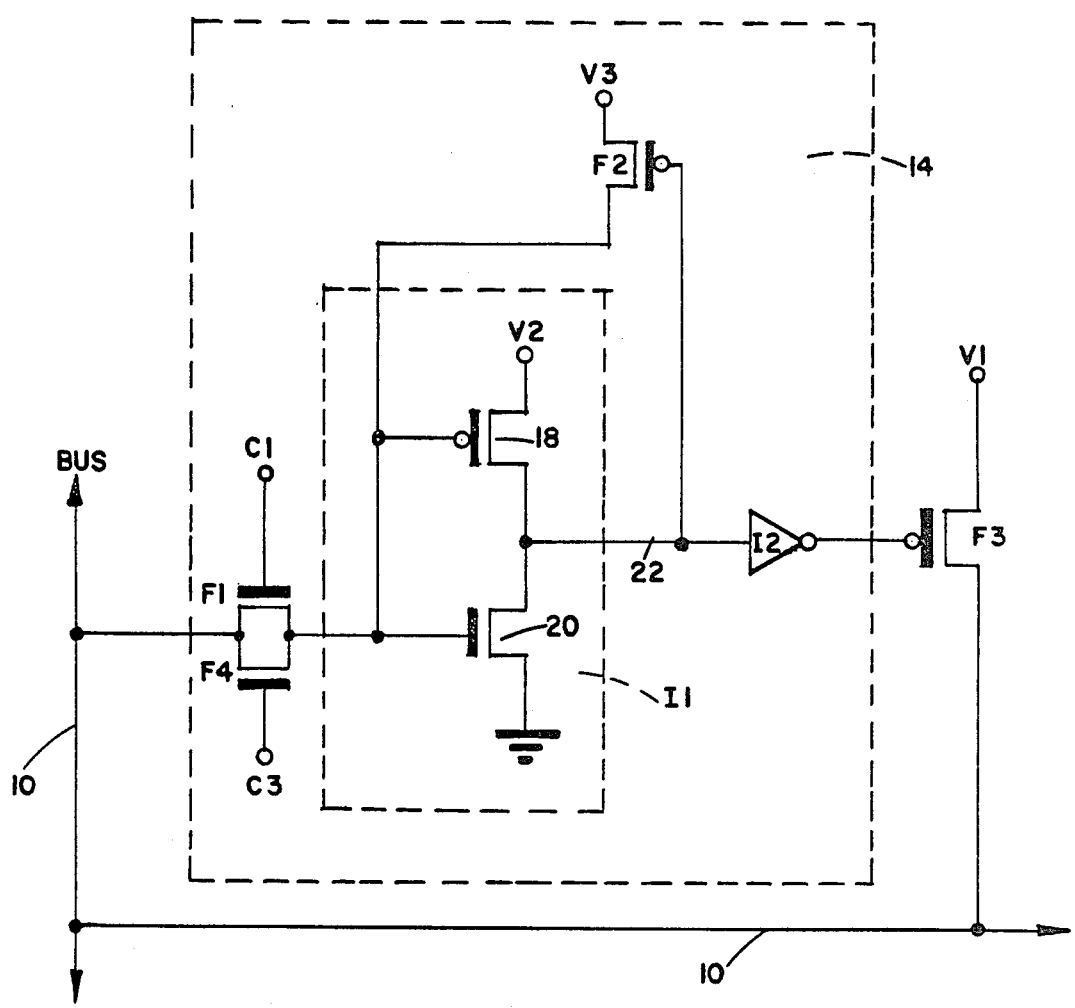
FIG. 3 shows a voltage regulation precharge circuit constructed according to the invention for performing two precharges per operation cycle.

Referring to FIG. 2, a preferred form of the voltage-regulating precharge circuit constructed according to the invention is shown connected to a capacitive load such as an integrated circuit bus line 10. A capacitor 12 is shown in the figure to represent the capacitance of the bus line 10.

The circuit includes a voltage source input terminal V1 suitable for receiving a precharge voltage from a voltage source (not shown). Such a voltage source outputs a voltage VDD, which is typically 5 volts. A switch, illustrated as a PFET F3, is connected with its conduction path between the voltage input terminal V1 and the bus line 10.

A voltage regulator 14 connected to the gate of the PFET F3 controls when the PFET F3 connects the voltage source input terminal V1 to the bus line 10. The regulator 14 includes a pair of inverters I1, I2 connected in series to the gate of the switch F3 to control the operation of that PFET switch. A second switch, illustrated as an NFET F1, is controlled at its gate by a precharge clock C1 to connect the input 16 of the first inverter I1 of the regulator with the bus 10 during the clock phase during which the bus line is to be precharged.

The first inverter I1 may include a PFET 18 connected in series with an NFET 20, the gates of both connected to the precharge switch F1, and with their conduction paths connected serially between a voltage source terminal V2 for a relatively high voltage, such as VDD, and a voltage source terminal for a relatively low voltage source, such as VSS. Again, VDD is typically 5 volts, and the terminal V2 may be connected to the same source as the voltage input terminal V1. VSS is typically ground potential. The conduction path of the inverter PFET 18 is connected between the voltage source terminal V2 and the first inverter output 22. The conduction path of the inverter NFET 20 is connected between the low voltage source terminal VSS and the first inverter output 22. If the voltage on the first inverter 16 input is low, the inverter PFET 18 is conductive, so the output of the first inverter is high (VDD). Conversely, if the voltage on the first inverter input is high, the inverter NFET is conductive, the voltage on the first inverter output is low (VSS).

A PFET F2 has its conduction path connected between a high voltage source input terminal and the input 16 of the first inverter I1, and has its gate connected to the output 22 of the inverter I1. The PFET F2 provides feedback to the inverter input 16 to reinforce the input applied through the input NFET F1. Such reinforcement makes it possible for the voltage level on the input 16 to rise all the way to VDD to turn the inverter PFET 18 fully off when a positive input is applied through the input NFET F1.

If the bus line 10 has previously been discharged to the low voltage level VSS prior to the precharge clock phase C1, the clock switch F1 is off. The output of the first inverter I1 is low, kept that way by the transistors of the inverter I1 and by the transistor F2 connected between a high voltage input and the gates of the inverter transistors. The output of the second inverter then is high, so that the precharge switch F3 is off.

At the precharge clock phase C1, the C1 clock signal goes high, turning the clock transistor F1 on to connect the input 16 of the first inverter I1 of the regulator to the bus line 10 to apply the low bus voltage VSS to the inverter I1. In response to the low input voltage, the inverter PFET 18 turns on and the inverter NFET 20 turns off to apply the high voltage VDD to the first inverter output 22. That high voltage is input to the second inverter I2 to cause the output of the inverter I2 to go low, thus turning on the P-channel precharge FET F3. The high voltage source connected to the voltage source input terminal V1 is now connected directly to the bus line 10 through the precharge PFET F3, and begins to charge the bus line. As the PFET F3 is driving in the easy direction, it can be relatively small compared to an NFET. During this time the PFET F2 is turned off, so the voltage on the first inverter input 16 is only the voltage on the bus line 10, applied through the NFET F1.

The voltage on the bus line 10 will continue to rise until the "trigger point" of the first inverter I1 is reached. At the trigger point, the NFET 20 in the inverter I1 is turned on and the PFET 18 is turned off to pull the output of the inverter I1 low to VSS. As the output of I1 falls, the PFET F2 connected to the output of I1 turns on to assist in raising the voltage on the input 16 to the first inverter to VDD and ensure its positive operation.

The trigger point of the inverter I1 is controlled by the relative sizes of the PFET and NFET in the inverter. This trigger point voltage may be set at any desirable level within the range of operating voltages for the integrated circuit by varying the relative sizes and turn-on and turn-off characteristics of the PFET 18 and the NFET 20. In some applications, a trigger point voltage of 2.0 to 2.5 volts has proven effective in getting an adequate precharge on to the bus lines, while not drawing excess power.

When the precharge voltage on the bus line 10 reaches the trigger point voltage level, the output of the inverter I1 goes low (to VSS) and the output of the inverter I2 goes high (to VDD), which turns off the precharge PFET F3, disconnecting the precharge voltage input terminal V1 and its associated voltage source from the bus line 10 and preventing further charging of the bus line. Thus, the precharge circuit performs a voltage regulation function on the precharge voltage level to limit the precharge voltage VPC to the trigger point voltage of the first inverter I1. Therefore, the trigger point voltage should be set at the desired precharge voltage level VPC.

A sender circuit 30 causes the bus line 10 to either remain at the precharge voltage VPC or to discharge to VSS, depending on the state of the input line IN during a second clock cycle phase C2. If the line IN is at a high voltage, the sender transistor 32 is on. When the clock pulse C2 turns the sender clock switch 34 on, the bus line 10 is connected to VSS and discharges to the low voltage. If, however, the voltage on the IN line is low, the sender transistor 32 is off, so that when the clock pulse C2 turns the clock switch 34 on, the bus line remains isolated from VSS and remains at the precharge voltage VPC.

A receiving circuit latch 40 connected to the bus 10 may look similar to the voltage-regulating precharge circuit. The receiving circuit 40 latches on to the bus value during the third clock phase C3. When the clock pulse C3 goes high, the receiver clock switch 42 turns on to connect the receiver latch 40 to the bus line 10. A receiver inverter I3 thus has its input connected to the bus line 10 through the clock switch 42 to receive the voltage level on the bus line.

The output of the inverter I3 is connected to the input of a second receiver inverter I4, the output of which is connected back to the latch node 48 through a clocked switch 44. When the latch node 48 is low, the feedback loop through the inverters I3-I4 keeps the latch node voltage from drifting up too far by reapplying the low voltage to the node 48 each clock pulse C1.

The output of the inverter I3 may be connected to the gate of a PFET 46 having its conduction path connected between a terminal V4 for receiving a high voltage and the latch node 48. That connection provides local feedback for maintaining the state of the latch 40 when it is latched high.

The receiver inverter 13 may also comprise a PFET and an NFET connected serially between the high voltage source VDD and the low voltage source VSS. The inverter 13 then has its own trigger point, the input voltage at which its output flips from low to high or from high to low. Such a trigger point is established by appropriate balancing of the PFET and NFET in the inverter I3. By setting the trigger point voltage of the inverter I3 slightly lower than the trigger point voltage of the first inverter I1 of the precharge circuit, it is assured that the precharge voltage PC on the bus is adequate to trigger the receiver latch 40. Such a technique also provides parameter tracking between the two circuits.

If two precharges per cycle are required on a bus in particular circumstances, such a double precharge can be performed by adding one small NFET F4 to the input of the first inverter I1 in parallel with the input NFET F1, to provide an additional connection between the bus line 10 and the inverter input 16 during another phase of the clock cycle, here illustrated as phase C3. The voltage source input V1 is then connected to the bus 10 to charge the bus during both C1 and C3, each for the time necessary to bring the bus voltage up to the trigger voltage of the inverter 11. Such an arrangement thus does not require the large additional precharge FET that is generally required in the art.

I claim:
1. A circuit for charging a capacitive load, comprising:
   a voltage source input;
   a voltage source switch connected between said voltage source input and said capacitive load; and
   a clock-controlled voltage regulator connected to said capacitive load and to said switch to close said switch during a first predetermined time period and thereby connect said voltage source input to said capacitive load, and to open said switch during said first predetermined time period and thereby disconnect said capacitive load from said voltage source input when the voltage on said capacitive load reaches a predetermined voltage level.

2. The circuit of claim 1, wherein said clock-controlled voltage regulator includes a clock-controlled switch connected to said capacitive load, for connecting said voltage regulator to said capacitive load during said first predetermined time period.

3. The circuit of claim 1 wherein said voltage regulator comprises an inverter having an input connected to said capacitive load and an output connected to said voltage source switch, and wherein said inverter causes said switch to conduct during said first predetermined time period only if the voltage on said capacitive load is below said predetermined voltage level.

4. The circuit of claim 3 wherein:
said switch comprises a PFET;
said circuit additionally comprises a second inverter having its input connected to said first inverter output and having its output connected to the gate of said PFET; and
said first inverter produces a high output when the voltage on said capacitive load is below said predetermined voltage, and said first inverter produces a low output when the voltage on said capacitive load is above said predetermined voltage.

5. The circuit of claim 4 wherein said first inverter comprises:
a second PFET connected between a high voltage input and said first inverter output and having its gate connected to said first inverter input; and
an NFET connected between a low voltage input and said first inverter output and having its gate connected to said first inverter input.

6. The circuit of claim 3, wherein said clock-controlled voltage regulator includes a clock-controlled switch connected to said capacitive load, for connecting said voltage regulator to said capacitive load during said first predetermined time period.

7. A circuit for charging a capacitive load, comprising:
a voltage source input;
a PFET switch connected between said voltage source input and said capacitive load; and
a voltage regulator connected to said capacitive load and to said switch, to open said switch and thereby disconnect said capacitive load from said voltage source input when the voltage on said capacitive load reaches a predetermined voltage level, wherein said voltage regulator comprises:
a first inverter having an input connected to said capacitive load and an output connected to said switch, and wherein said first inverter produces a high output when the voltage on said capacitive load is below said predetermined voltage, and said first inverter produces a low output when the voltage on said capacitive load is above said predetermined voltage; thereby causing said switch to conduct only if the voltage on said capacitive load is below said predetermined voltage level, wherein said first inverter comprises:
a second PFET connected between a high voltage input and said first inverter output and having its gate connected to said first inverter input;
an NFET connected between a low voltage input and said first inverter output and having its gate connected to said first inverter input; and
a second inverter having its input connected to said first inverter output and having its output connected to the gate of said PFET; and
a third PFET connected between a second high voltage input and said first inverter input, and having its gate connected to said first inverter output.

8. A circuit for charging a capacitive load, comprising:
a voltage source input;
a PFET switch connected between said voltage source input and said capacitive load; and
a voltage regulator connected to said capacitive load and said switch to open said switch and thereby disconnect said capacitive load from said voltage source input when the voltage on said capacitive load reaches a predetermined voltage level, wherein said voltage regulator comprises:
an inverter having an input connected to said capacitive load and an output connected to said switch, and wherein said first inverter produces a high output when the voltage on said capacitive load is below said predetermined voltage, and said first inverter produces a low output when the voltage on said capacitive load is above said predetermined voltage, thereby causing said PFET inverter causes said switch to conduct only if the voltage on said capacitive load is below said predetermined voltage level;
a second inverter having its input connected to said first inverter output and having its output connected to the gate of said PFET; and
a timing switch controlled by a clock for connecting said first inverter input to said capacitive load during a first clock period.

9. The circuit of claim 8, additionally comprising a receiver latch comprising:
a third inverter having an input connected to said bus line and having an output; and
a fourth inverter having an input connected to said first inverter output and having an output.

10. A circut for precharging an integrated circuit bus during a first time period, comprising:
a voltage source input for receiving an input voltage;
a PFET having its conduction path connected between said input and said bus; and
a voltage regulator connected to said bus and to the gate of said PFET for causing said PFET to be conductive during said first time period only if the voltage on said bus is less than a predetermined voltage, wherein said voltage regulator causes said PFET to commence conducting at the beginning of said first time period.

11. The circuit of claim 10, wherein said voltage regulator comprises:
a first inverter having its input connected to said bus, and having an output, wherein the output of said first inverter is low when the voltage on said first inverter input is at or above said predetermined voltage, and the output of said first inverter is high when the voltage on said first inverter input is below said predetermined voltage; and
second inverter having an input connected to the output of said first inverter and having an output connected to said gate of said PFET.

12. A circuit for precharging an integrated circuit bus during a first time period, comprising:
a voltage source input for receiving an input voltage;
a PFET having its conduction path connected between said input and said bus; and
a voltage regulator connected to said bus and to the gate of said PFET for causing said PFET to be conductive during said first time period only if the voltage on said bus is less than a predetermined voltage; wherein said voltage regulator comprises:
a first inverter having its input connected to said bus, and having an output, wherein the output of said first inverter is low when the voltage on said first inverter input is at or above said predetermined voltage, and the output of said first inverter is high when the voltage on said first inverter input is below said predetermined voltage; and
a second inverter having an input connected to the output of said first inverter and having an output connected to said gate of said PFET; and
wherein said first inverter comprises:
an inverter PFET having its conduction path connected between a second voltage source input and said first inverter output, and having its gate connected to said first inverter input; and
an inverter NFET having its conduction path connected between a third voltage source input and said first inverter output, and having its gate connected to said first inverter input;
wherein said predetermined voltage is determined by the relative conduction properties of said inverter PFET and said inverter NFET.

13. The circuit of claim 12, wherein said second voltage source input is connected to a voltage source of higher potential than the voltage source connected to said third voltage source input.

14. A circuit for precharging an integrated circuit bus during a first time period, comprising:
a voltage source input for receiving an input voltage;
a PFET having its conduction path connected between said input and said bus; and
a voltage regulator connected to said bus and to the gate of said PFET for causing said PFET to be conductive during said first time period only if the voltage on said bus is less than a predetermined voltage, wherein said voltage regulator comprises:
a first inverter having its input connected to said bus, and having an output, wherein the output of said first inverter is low when the voltage on said first inverter input is at or above said predetermined voltage, and the output of said first inverter is high when the voltage on said first inverter input is below said predetermined voltage;
a second inverter having an input connected to the output of said first inverter and having an output connected to said gate of said PFET; and
a switch for connecting said first inverter input to said bus during said first time period.

15. The circuit of claim 14 wherein said voltage regulator additionally comprises a second switch connected in parallel to said first switch for connecting said first inverter input to said bus during a second time period.

16. A circuit for precharging an integrated circuit bus line to a first determined voltage level during a first time period, comprising:
a first inverter, comprising:
a first NFET having its conduction path connected between a low voltage input terminal and an output terminal;
a first PFET having its conduction path connected between a first high voltage input terminal and said output terminal; and
an input connected to the gate of said NFET and to the gate of said PFET, wherein said PFET and said NFET are balanced so that when the voltage on said input is above said first predetermined voltage, said first NFET conducts to connect said output terminal to said low voltage input terminal, and when the voltage on said input is below said first predetermined voltage, said first PFET conducts to connect said output terminal to said first high voltage input terminal;
a second NFET having its conduction path connected between said bus line and said inverter input, and having its gate connected to a clock input for receiving a pulse during said first time period, for connecting said bus line and said inverter input during said first time period;
a second inverter having its input connected to said first inverter output and having an output;
a second PFET having its conduction path connected between a second high voltage input terminal and said bus line, and having its gate connected to said second inverter output.

17. The circuit of claim 16, additionally comprising a third PFET having its conduction path connected between a third high voltage input terminal and said first inverter input, and having its gate connected to said first inverter output.

* * * * *